United States Patent [19]

Otani et al.

[11] Patent Number: 4,846,623
[45] Date of Patent: Jul. 11, 1989

[54] WAFER TRANSFERRING DEVICE

[75] Inventors: Masami Otani, Nagaokakyo; Masami Nishida, Muko; Masahiro Himoto, Takatsuki; Akio Tsuchiya, Muko, all of Japan

[73] Assignee: Dainippon Screen Mfg. Co., Ltd., Japan

[21] Appl. No.: 106,584

[22] Filed: Oct. 8, 1987

[30] Foreign Application Priority Data

Oct. 8, 1986 [JP] Japan .................................. 61-239891
Oct. 8, 1986 [JP] Japan ............................ 61-154748[U]
Feb. 27, 1987 [JP] Japan .................................. 62-046228

[51] Int. Cl.⁴ ............................................. B65H 3/00
[52] U.S. Cl. .................................. 414/225; 198/339.1; 198/468.6
[58] Field of Search ........................ 414/217, 222, 225; 198/468.6, 339.1, 346.2, 468.4

[56] References Cited

U.S. PATENT DOCUMENTS 4,208,159 6/1980 Uehara et al. ........................ 414/225
4,648,786 3/1987 Sakurai ............................ 901/16 X
4,712,963 12/1987 Kondo .................................. 414/222

FOREIGN PATENT DOCUMENTS 163933 12/1979 Japan .

Primary Examiner—Frank E. Werner
Assistant Examiner—Donald W. Underwood
Attorney, Agent, or Firm—Ostrolenk, Faber, Gerb & Soffen

[57] ABSTRACT

A wafer transferring device for transferring a wafer to be treated from a wafer supply station of a wafer treating apparatus to a wafer holding member, where the wafer is treated, and from the holding member to a wafer discharge station. The device includes a transfer unit for separately supporting untreated and treated wafers at different heights relative to one another. A carrier unit moves horizontally and reciprocates between the supply and discharge stations and toward and away from the holding member integrally with the transfer unit and is adapted to move up and down the transfer unit.

4 Claims, 9 Drawing Sheets

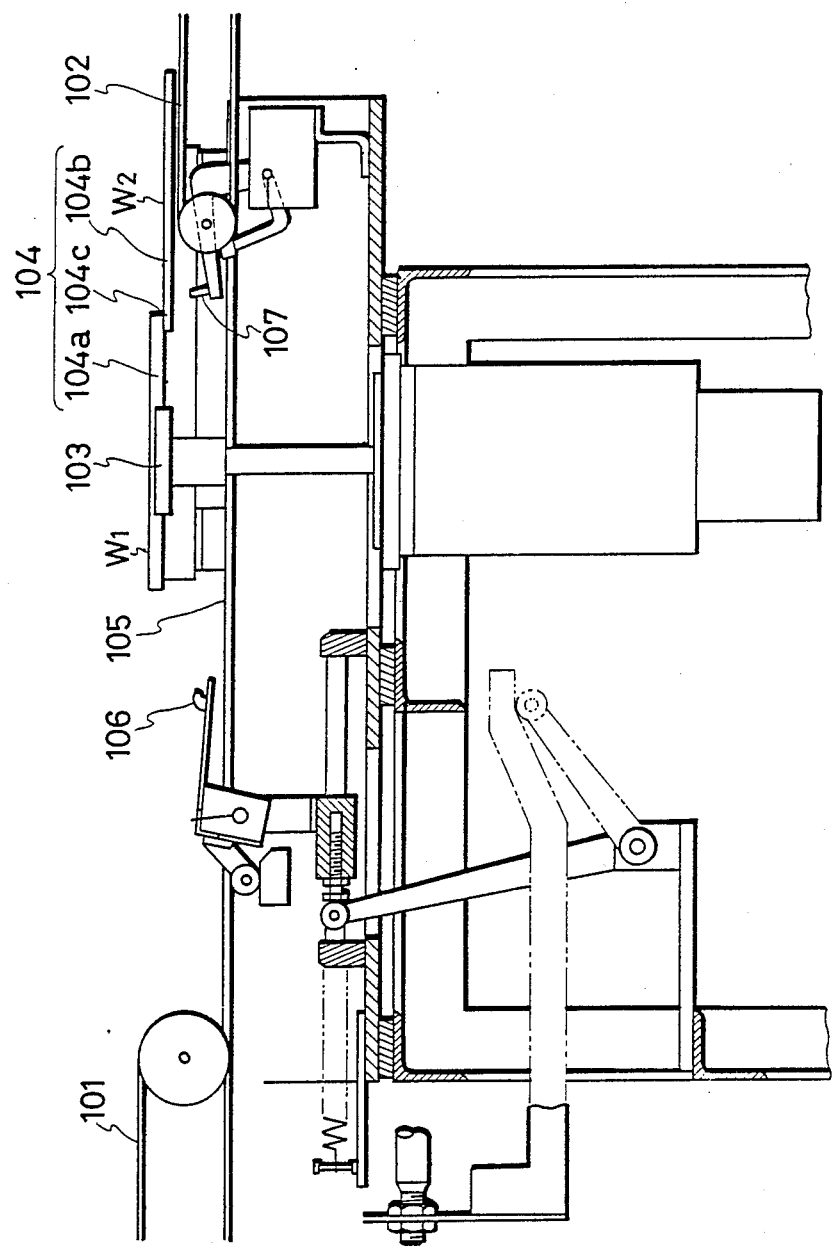

WAFER TRANSFERRING DEVICE

BACKGROUND OF THE INVENTION

1. Field of the Invention

The present invention pertains to a device for transferring thin plate substrates, glass substrates, etc. (hereinafter referred to as "wafers" generically), and more particularly to a device for transferring wafers to be treated to and transporting treated wafers from a holding member. The holding member holds the wafers one at a time, receives them consecutively and operates in the manner of a rotary circular vacuum chuck member found in a treating part of a variety of types of apparatuses for treating the wafers while rotating the same, and as a susceptor in a lamp annealing apparatus, and the like.

2. Description of the Prior Art

A wafer transferring device is described in Japanese Patent Application Kokai No. 53-73372 (Kokai No. 54-163933). FIG. 11 herein is a schematic vertical sectional view illustrating a conventional apparatus for supplying a water W1 to be treated to a rotary circular vacuum chuck member 103 and carrying away a treated wafer W2 simply by horizontally reciprocating just one time a wafer transfer unit 104 between a start position adjacent to a supply belt conveyor member 101 and a discharge belt conveyor member 102.

Care is taken to assure that the level of the wafer conveying surface of the member 101 is higher than that of the wafer holding surface of the member 103, while the surface of the member 103 is higher than that of the wafer surface of the member 102. Furthermore, the level of an untreated wafer placing part 104a of the unit 104 is lower than that of the upper surface of the member 101, whereas it is higher than that of the surface of the member 103. On the other hand, the level of a treated wafer placing part 104b of the unit 104 is lower than that of the surface of the member 103, while it is higher than that of the surface of the member 102. The unit 104 travels along a rail 105 horizontally from the left to right parallel to the plane of FIG. 11 upon receiving on its untreated wafer placing part 104a the wafer W1 being projectingly handed over from the member 101. When passing the chuck member 103, the unit 104 receives the treated wafer W2, on its treated wafer placing part 104b, by bumping the rear edge, as viewed in the above direction, of the wafer W2 at a step 104c thereof defined by adjoining portions of the parts 104a and 104b in different heights. When the unit 104 reaches the discharge conveyor member 102, a pin 107 jumps up to contact the aforesaid edge of the wafer W2, and then the transferring unit 104 is returned to the start position with the wafer W2 being deterred by the pin 107 from being drawn by the returning unit 104, thereby permitting the wafer W2 to remain on the discharge conveyor member 102. Thus, the transfer of the wafer W2 onto the member 102 from the unit 104 is effected.

During the transferring operation, as unit 104 is returned to the start position, a detent piece 106 rises up and makes contact with the front edge, as viewed in the right to left direction parallel to the plane of the drawing, of the wafer W1 at the time the unit 104 passes the chuck member 103, so that the wafer W1 on the part 104a is transferred onto the chuck member 103.

In this type of the device, however, certain problems remain. The transfer of the treated and untreated wafers W2 and W1 onto the discharge conveyor member 102 and onto the vacuum chuck member 103 from transferring unit 104 is effected by moving the member 103 toward the supply conveyor member 101 while preventing the wafers from moving horizontaly along with the unit 104 by means of the pin 107 and the detent piece 106. This causes the lower surfaces of the wafers to rub against the upper surfaces of the parts 104b and 104a. Consequently, the surfaces of the wafers W1 and W2 are minutely impaired and soiled by the prior art's transfer mechanism.

Furthermore, the transfer of the wafer W2 from the chuck member 103 onto the part 104b of the unit 104 is effected by causing the left-wise moving step 104c of the unit 104 to bump/push forward the rear edge of the wafer W2. Consequently, the lower surface of the wafer W2 is forced to rub against the upper surface of the member 103, thereby creating fine scratches in and staining the lower surface of the wafer.

SUMMARY OF THE INVENTION

With a view to solving the aforementioned problems, it is an object of the present invention to provide a novel and improved wafer transferring device.

Another objective of the invention is to provide a wafer transferring device according to which both the untreated and treated wafers are handled such as to prevent their lower surfaces from rubbing against on the upper surface of the holding member in the treating part of the wafer treating apparatus while being transferred, thus avoiding the fine scratches and staining of the lower surfaces thereof in any manner.

In accordance with one aspect of the invention, there is provided a wafer transferring device for transferring a wafer to be treated from a wafer supply part of a wafer treating apparatus to a wafer holding member in a treating part of the apparatus and further for transferring an already treated wafer from the holding member to a wafer discharge part of the apparatus. The device comprises transfer means for placing each respective untreated wafer and a treated wafer separately in different heights. The device includes further means for reciprocating the transfer means between the wafer supply and discharge parts via the holding member and for vertically moving the transfer means.

Hence, according to the invention, since the wafers are transferred by a transfer means which is capable of vertical motion, the lower surfaces of the wafers will not rub against the upper surface of the wafer holding member. Thus no fine scratching or staining of the lower surfaces of the wafer occurs, whatsoever.

Furthermore, since the wafer to be treated is supplied from the supply part to the holding member and the wafer already treated is discharged to the discharge part through a single reciprocation of the transfer means between the supply and discharge parts, a high wafers throughput is positively assured.

In a preferred embodiment, the reciprocating and moving means comprises means for positioning the transfer means at a plurality of vertically different levels.

In another preferred embodiment, the transfer means comprises placing means having a first surface relatively closer to the wafer supply part and a second surface relatively closer to the wafer discharge part, the placing means being effective for placing on the first surface the wafer to be treated and placing on the second surface the wafer already treated.

In still another preferred embodiment, the first surface is higher than the second surface.

In a further preferred embodiment, the first surface is lower than the second surface.

Hence, according to the embodiment, since the first surface for placing thereon the wafer to be treated is lower than the second surface for placing thereon the wafer already treated, fine particles or the like sticking to the former wafer is prevented from adhering to and contaminating the latter wafer.

Preferably, the positioning means positions the transfer means at vertically spaced first, second, and third levels respectively. The first surface is lower than a wafer placing surface of the wafer supply part and a wafer holding surface of the holding member when the transfer means is positioned at the first level, while the first surface is higher than the surfaces of the supply part and the holding member when the transfer means is positioned at the second and third levels, and the second surface is lower than the surface of the holding member and a wafer placing surface of the wafer discharge part when the transfer means is positioned at the first and second levels, whereas the second surface is higher than the surfaces of the holding member and the discharge part when the transfer means is positioned at the third level.

More preferably, the device further comprises respective means for vertically moving the wafer supply part and the wafer discharge part independently.

Still preferably, the reciprocating and moving means comprises means for positioning the transfer means vertically at a fourth level at which the first and second surfaces are lower than the wafer holding surface of the holding member, and at a fifth level at which the first and second surfaces are higher than the surface of the holding member.

Further preferably, the wafer supply part moving means positions the wafer placing surface of the supply part higher and lower than the first surface when the transfer means is positioned at the fourth level, and the wafer discharge part moving means positions the wafer placing surface of the discharge part higher and lower than the second surface when the transfer means is positioned at the fifth level.

In accordance with another aspect of the invention, there is provided a wafer transferring device for transferring a wafer to be treated from a wafer supply part of a wafer treating apparatus to a wafer holding member in a treating part of the apparatus and for transferring a wafer already treated from the holding member to a wafer discharge part of the apparatus. The device comprises a base member which is capable of reciprocating between the wafer supply part and the wafer discharge part via the wafer holding member; a vertically movable member mounted with the base member to reciprocate integrally therewith; means for vertically guiding the movable member; transfer means, fixed on the movable member, for placing thereon the wafer to be treated and the wafer already treated; a member associated with the movable member and extending parallel with a direction in which the base member reciprocates; and driving means for vertically moving the associated and extending member parallel with the direction to thereby vertically move the movable member relative to the base member through the guiding means.

In the present invention the driving means for vertically moving the transfer means operates independently of the base member. Consequently, the driving means are not constrained to move in a direction parallel with the base member reciprocating direction, e.g. horizontal direction. As a result, lines and wiring for driving and controlling the means are free from being shifted about and from causing undesired bending and soiling or fouling. The device's durability is therefore high. Furthermore, since the device as a whole is not required to move vertically, the device can be substantially smaller in structure and ore convenient to use and operate.

The foregoing and other objectives and attendant advantages of the present invention will be readily appreciated from the following detailed description which refers to the accompanying drawings.

BRIEF DESCRIPTION OF THE DRAWINGS

FIG. 11 is schematic vertical sectional view showing the, previously described, conventional wafer transferring device.

DETAILED DESCRIPTION OF THE PREFERRED EMBODIMENTS

Figure 1:
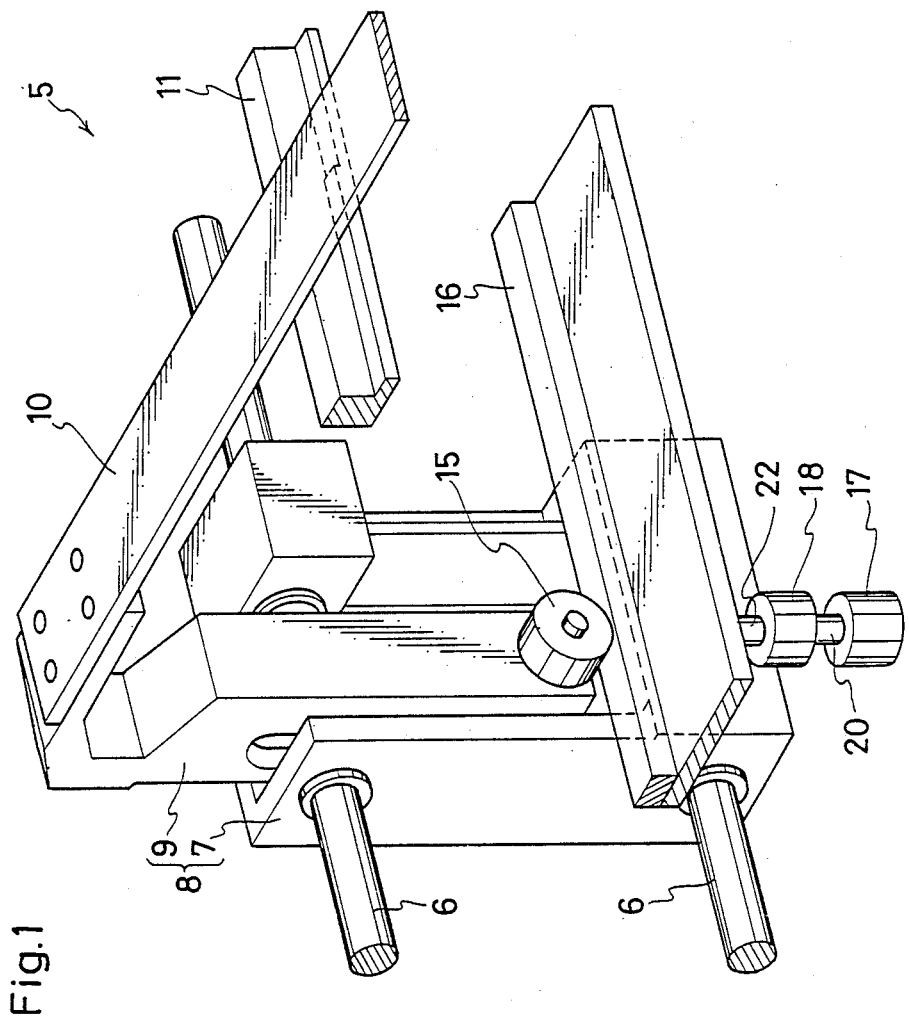
FIG. 1 is a perspective view illustrating a wafer transferring device according to an embodiment of the invention.
Figure 2:
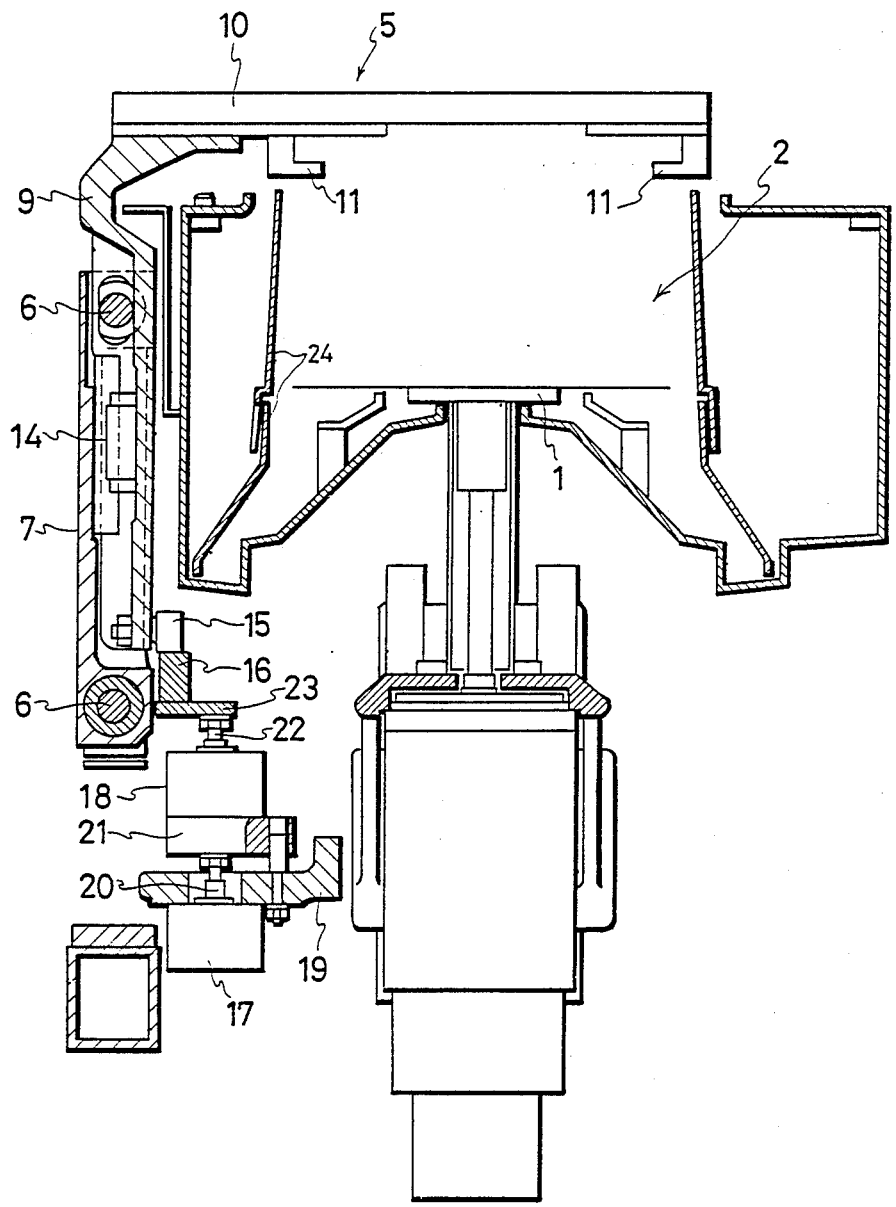
FIG. 2 is a vertical sectional view depicting a wafer treating part of an apparatus for treating wafers while rotating the same conventionally known to the art, which incorporates the device of FIG. 1.
Figure 3:
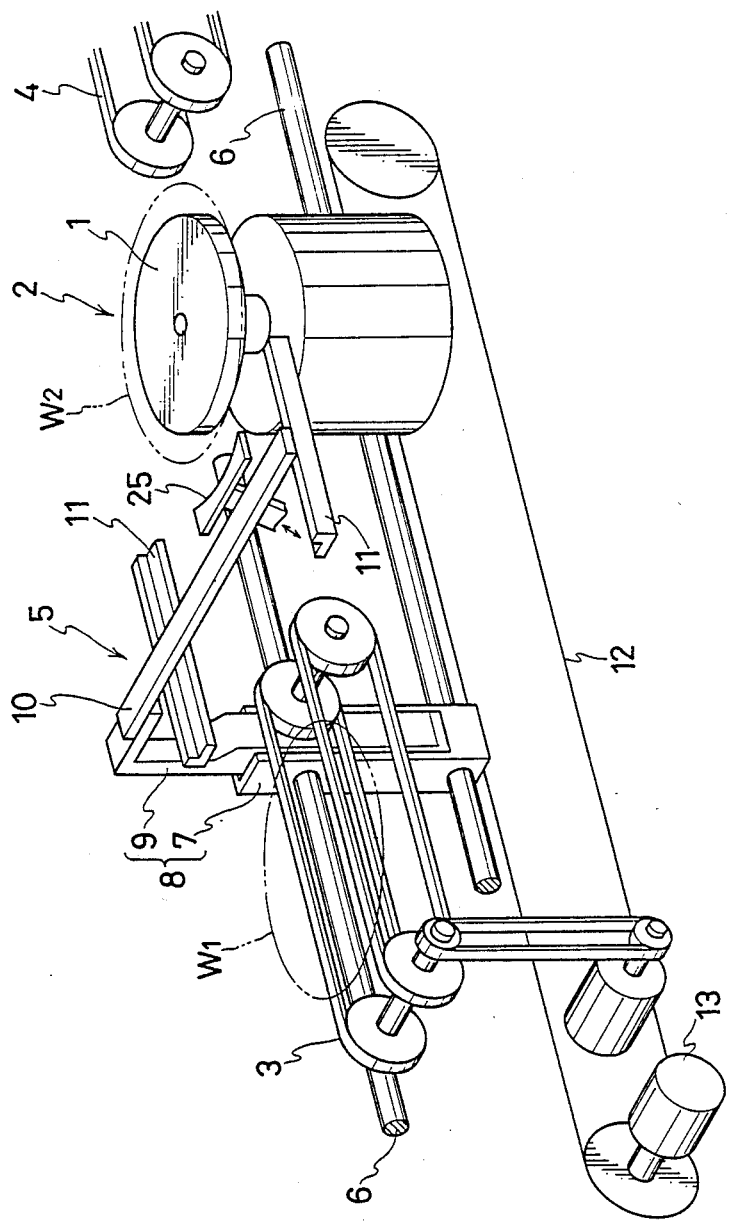
FIG. 3 is a perspective view schematically showing the apparatus.

Referring to the drawings, FIG. 1 is a perspective view illustrating a wafer transferring device according to an embodiment of the invention, FIG. 2 is a vertical sectional view of a conventional wafer treating part of a wafer treating apparatus which incorporates the device of FIG. 1, and FIG. 3 is a perspective schematic of the apparatus.

A rotary circular vacuum chuck 1 for holding wafers through the application of vacuum, in conventional manner, is provided in the wafer treating part 2 of the treating apparatus. Across the chuck 1, are disposed a wafer supply belt conveyor 3 and a wafer discharge belt conveyor 4, oppositely to one another. In order to transfer wafers from the conveyor 3 onto the chuck 1 and further from the chuck 1 to the conveyor 4, there is provided a wafer transferring device assembled of a transfer unit 5 and a carrier unit 8. The transfer unit 5 is constituted of a link arm 10 supported on the upper portion of a frame 9, overhanging the conveyors 3 and 4 and the chuck 1 during horizontal motion thereof, and of a pair of holding arms 11, one L and the other reversed L shaped (FIG. 4), formed on the lower surface of the arm 10. The arms 11 extend opposite but parallel one another in a direction to transfer the wafers, and are formed with projections 11a and 11b respectively which face inward and toward one another. Each of the projections 11a and 11b is divided into two segments 11e relatively closer to the conveyor 3 and 11f relatively closer to the conveyor 4 with respect to the center line of that portion of the arm 11 which is connected with the arm 10. The upper surfaces of the former and latter segments have different heights, i.e. the upper surface of the segment 11e for exclusively holding thereon the untreated wafers W1 is higher than that of segment 11f that is provided for holding thereon the already treated wafers W2. The elements 3 and 4 may also be referred to as the wafer supply station 3 and the wafer discharge station 4, respectively.

The carrier unit 8, which supports the transfer unit 5, moves horizontally between the supply and discharge conveyors 3 and 4, and is formed of a base frame 7 and a moving frame 9. The frame 7 is horizontally movable on a pair of guide bars 6 extending between the horizontally parallel conveyors 3 and 4. Further, the frame 7 is fixed at its lower end on a timing belt 12 that is operated by the motor 13. Accordingly, the frame 7 is capable of reciprocating between the conveyors 3 and 4 by driving of motor 13 in one or the other direction.

The moving frame 9 is mounted to the frame 7 such that the frame 9 is capable of moving right vertically through a guide 14 suc as a slide bearing. On an outer surface of a lower end portion of the frame 9, there is rotatably supported a roller 15. Right beneath the roller 15 and parallel with the guide bars 6, there is disposed a rail 16 for supporting the roller 15, which is moved up and down in two-step way, i.e. from a lower to an upper level and from the upper to the lower through a middle level, by two air cylindes 17 and 18 coupled in series and vertically with each other. The body of the lower cylinder 17 is fixed to a main frame 19 of the treating apparatus, while the upper cylinder 18 is mounted to the frame 19 in a manner that allows it to move up and down relative to frame 19. A piston rod 20 of the cylinder 17 is linked with a cylinder bottom 21 of the cylinder 18. Further, a piston rod 22 of the cylinder 18 abuts against a lower surface of a supporting member 23 for supporting the rail 16. In order to move up and down the rail 16 horizontally, there are disposed two sets of the cylinders 17 and 18, coupled with each other in series, substantially at both end portions of the rail 16 respectively. When the cylinders 17 and 18 are stretched, the rail 16 is moved up, and accordingly the frame 9 is raised up through the upward pushing of the rail 16 on the roller 15.

The position of the holding arm 11 of the transfer unit 5 resulting from neither of the cylinders 17 and 18 being stretched is referred to herein as a first level. The level assumed by the arm 11 when either one of the cylinders 17 or 18 (the cylinder 17 in this embodiment) is extended will be referred to as a second level; and a level of the arm 11 resulting from extending of both the cylinders is a third level.

The level of the wafer conveying surface of the conveyor 3 (hereinafter referred to as "a reference level") is the same as that of the wafer holding surface of the chuck 1 and as that of the wafer conveying surface of the conveyor 4. Moreover, the level of the segment 11e of the holding arm 11 is lower than the reference level when the frame 9 is at the first level, and is higher than the reference level when the frame 9 is moved up for the holding arm 11 to reach the second and third levels. In the meantime, the segment 11f is lower than the reference level when the holding arm 11 is at either the first or second level, and is higher than the reference level when the holding arm 11 is at the third level.

The wafer transferring device of the invention operates as follows.

During a treating phase, the wafer is subjected to predetermined treatments at part 2 and the transfer unit 5 is at a position to stand by to transfer the wafer. The position corresponds to an end position of the wafer conveyance by the conveyor 3. After the part 2 completes the predetermined treatments, the lower cylinder 17 is actuated to extend so that the frame 9 of the unit 5 is raised for the holding arm 11 to be lifted to the second level from the first level. Accordingly, the wafer W1 to be treated is being conveyed on the conveyor 3 is picked or scooped up onto the segment 11e of the arm 11 that is being lifted up toward the second level.

After the arm 11 has reached the second level, the motor 13 is driven to move the transfer unit 5, which holds the wafer W1 on the segment 11e, toward the treating part 2 with the arm 11 kept at the second level. While the unit 5 is shifted, the segment 11f is moved beneath the wafer W2 that has undergone the treatments. When the unit 5 arrives at the rotary circular chuck 1, the motor 13 is stopped and the upper cylinder 18 is extended to further raise the frame 9 for the arm 11 to reach the third level. As a result, the wafer W2 on the chuck 1 is then picked up onto the segment 11f of the arm 11 and is thus lifted toward the third level. After the arm 11 reaches the third level, the motor 13 is again driven to move the transfer unit 5, transporting the wafers W1 and W2 on the segments 11e and 11f respectively, toward the conveyor 4 with the arm 11 maintained at the third level.

When the unit 5 arrives at a start position of the wafer conveyance of the conveyor 4, the upper cylinder 18 is retracted causing the arm 11 to be shifted down to the second level. Thus, the treated wafer W2 on the segment 11f of the arm 11 being lowered toward the second level is transferred onto the conveyor 4. After the arm 11 reaches the second level, the motor 13 is driven in the opposite direction to return the transfer unit 5 toward the aforementioned stand-by position until the segment 11e of the arm 11 is positioned above the chuck 1. As the unit 5 is being so shifted, a detent piece 25 abuts against the front outer peripheral edge, as viewed in the moving direction, of the untreated wafer W1 on the segment 11e, in order that the center of the wafer W1 is positioned right above and vertically aligned with the center of the wafer holding surface of the chuck 1. After the wafer W1 is thus properly positioned and the unit 5 is stopped, the cylinder 17 is retracted for the arm 11 to be lowered to the first level, and accordingly the wafer W1 to be treated next on the segment 11e of the arm 11 is transferred therefrom onto the chuck 1. Then, the unit 5 is restored to the stand-by position by again actuating the motor 13 with the arm 11 being at the first level.

That side of the detent piece 25 which abuts against the outer peripheral edge of the wafer W1 is shaped to be of the same curvature as that of the edge of the wafer W1. Except when the wafer W1 to be treated is being transferred, the piece 25 is situated below a predetermined position whereat it may contact the wafer W1 to avoid creating an obstacle to the horizontal motion of the unit 5 between the conveyors 3 and 4. In other words, the detent piece 25 is movable such that it contacts the wafer W1 for purposes of centering the wafer W1 on the holding member and is at other time disposed not to interfere with the movement of same. Besides, the provision of such piece 25 may be omitted where accurate positioning of the untreated wafer W1 relative to the wafer holding surface of the chuck 1 is not needed.

Reference numeral 24 denotes a shield surrounding the chuck 1 so as to prevent treating liquids, which are applied to the wafer for the undesired treatments, from scattering about.

In the above embodiment, the levels of both the wafer holding and conveying surfaces of the chuck 1 and conveyor 4 are the same as the reference level, i.e., the level of the wafer conveying surface of the conveyor 3. However, when the surface of the conveyor 4 is at a level higher than the reference level, for example, by a distance t1, the cylinder provided for lifting the arm 11 from the second level to the third one (the upper cylinder 18 in the foregoing embodiment) is modified to extend further than in the above embodiment by a length equal to the distance t1, in order to raise the arm 11 to the elevated level of the surface of the conveyor 4.

Figure 5:
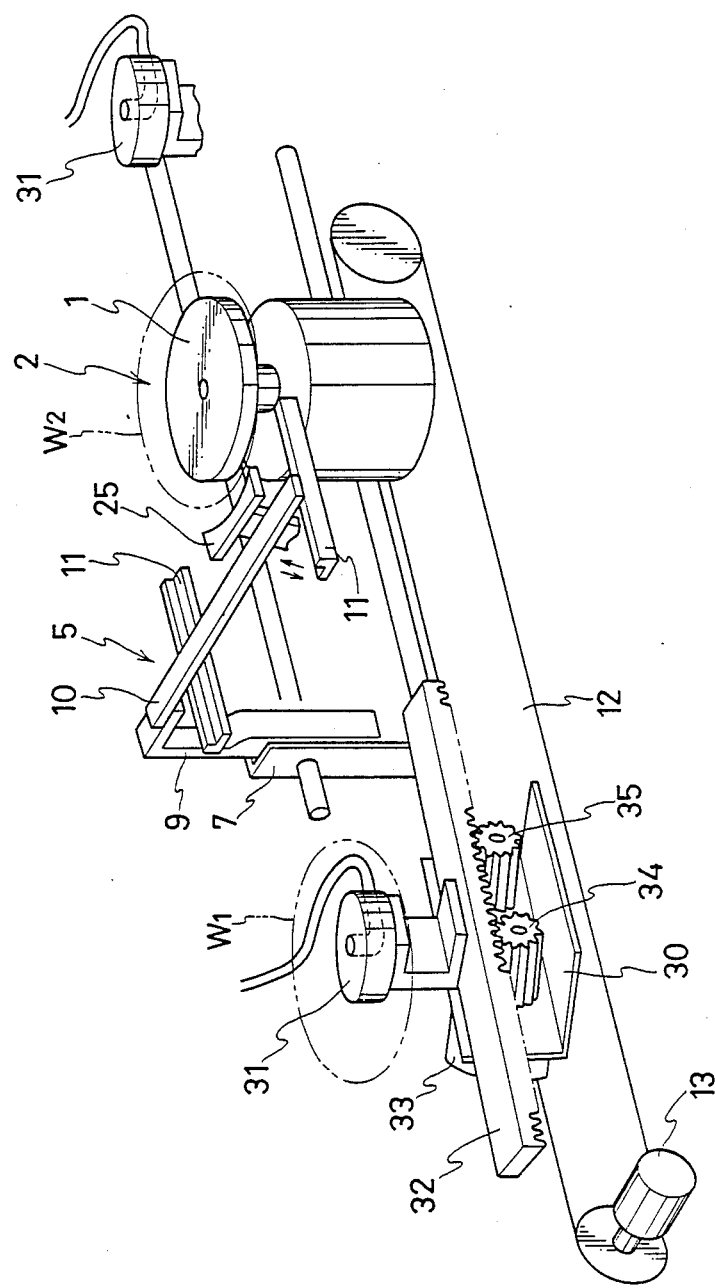
FIG. 5 is a schematic perspective view illustrating the device applied to the apparatus in conjunction with a variant form for wafer supply and discharge mechanisms.

FIG. 5 is a schematic view illustrating a variant form of the conveyors 3 and 4 for the wafer supply and discharge mechanisms in the embodiment previously described. Specifically, the conveyors 3 and 4 are replaced by two mechanisms disposed across the chuck 1 of the treating part 2 which mechanisms perform the same functions as the conveyors 3 and 4. (The two mechanisms are similar and accordingly only one is illustrated in the drawing.)

On a bracket 30, fixed to the main frame of the treating apparatus, is secured a motor 33 for driving a pinion 34 to rotate. Also on the bracket 30, there is rotatably supported a guide pinion 35. The tops of these pinions is engaged by a rack 32 and a vacuum chuck member 31 for holding the wafers W1 and W2 is fixedly mounted on the rack 32. By actuating the motor 33 to rotate the pinion 34, the rack 32 serves to transport the wafer being held on the chuck member 31 horizontally through the action of the pinions 34 and 35 engaging the rack 32. Thus, the untreated wafer W1 is supplied to the chuck 1 from the first mechanisms of the aforementioned arrangement and the treated wafer W2 is discharged from the chuck 1 to the other mechanisms of the arrangement.

Figure 6:
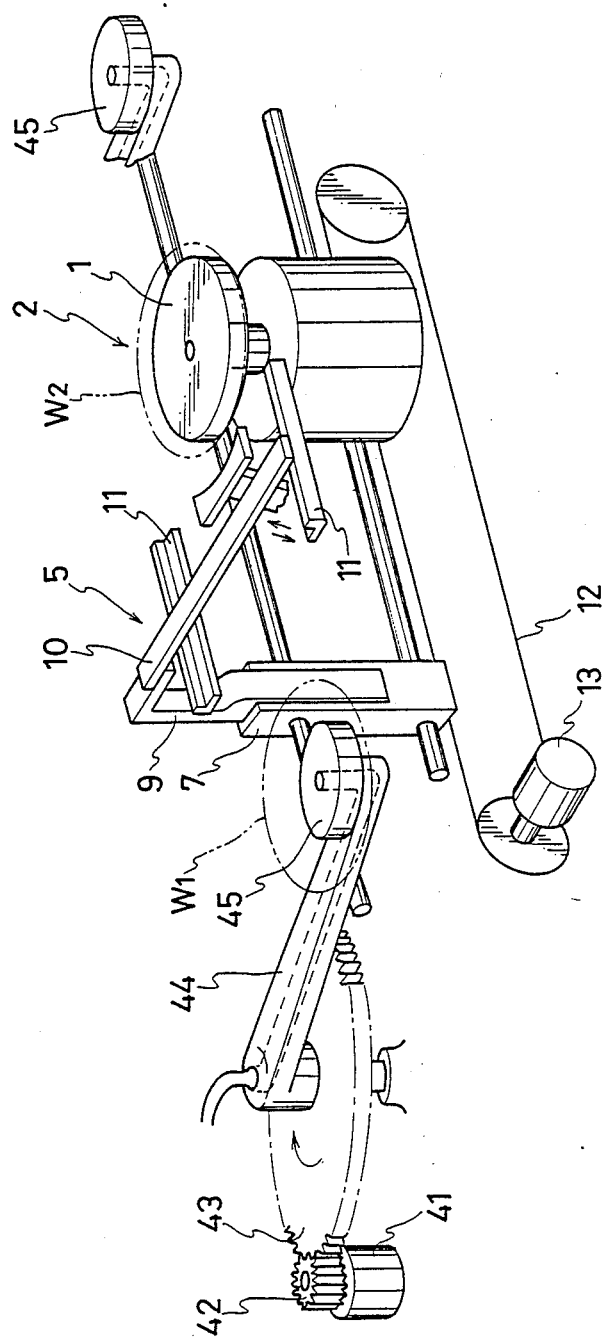
FIG. 6 is a schematic perspective view showing the device applied to the apparatus in conjunction with another variant embodiment for the mechanisms.

FIG. 6 depicts yet another variant of a wafer supply and discharge mechanism. As in the foregoing embodiment, two sets of identical mechanisms are disposed one each on opposed sides of the chuck 1 of the treating part 2 and as before, for brevity, only one for the identical mechanisms is illustrated.

On the main frame of the treating apparatus is fixed a motor 41 on whose rotary shaft is mounted a pinion 42. Furthermore, on the main frame is supported an arm 44 at its base portion in an orientation that allows it to rotate horizontally. At the base portion of the arm 44 is securedly connected a gear 43, which is rotatably driven by the pinion 42. At the end portion of the arm 44, there is fixedly provided a vacuum chuck member 45 for holding, by vacuum, thereon the wafers W1 and W2. By driving the motor 41 in each of the two mechanisms, the pinion 42 is rotated while engaging with the gear 43, so that the arm 44 is horizontally rotated, carrying the wafer W1 or W2 being held on the member 45. Thus, the wafer W1 to be treated is supplied to the rotary chuck 1 from the chuck member 45 in the wafer supply mechanism, and further the wafer W2 is discharged from the chuck 1 to the member 45 in the wafer discharge mechanism.

Figure 7:
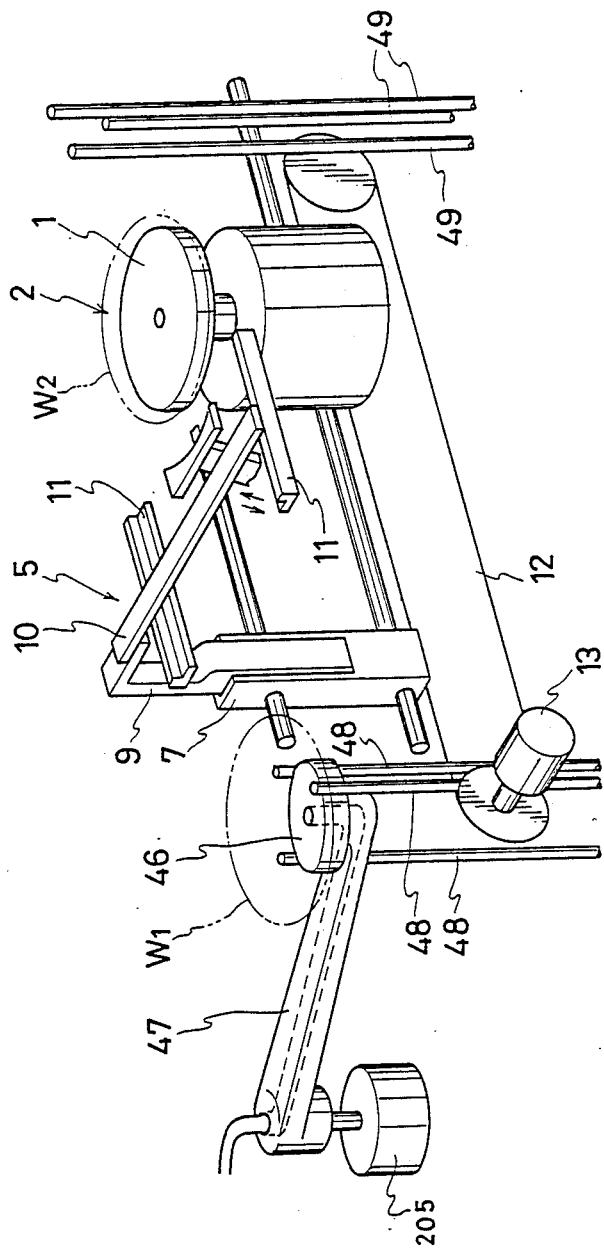
FIG. 7 is a schematic perspective view illustrating the device applied to the apparatus in conjunction with still another variant embodiment for the mechanisms.

FIG. 7 illustrates still another variant of wafer supply and discharge mechanisms. As in the preceding variants, two identical sets of the below-described arrangements are disposed across the chuck 1. (As before only one is illustrated.)

For the wafer supply mechanism, at a driving member 205 that is designed to rotate and move up and down, is fixedly supported on its base portion, an arm 47 in a manner allowing horizontally rotation. At the end portion of the arm 47 is secured a vacuum chuck member 46 for holding thereon the wafer W1. Furthermore, there are provided a plurality of pins 48 for placing the wafer W1. Thus, by actuating the driving member 205, the arm 47 is horizontally rotated, while carrying the wafer W1 being held on the chuck member 46, so as to transport the wafer W1 onto the pins 48. Similarly, for the discharge mechanism, the same arrangement is made in order that the treated wafer W2 is in the first place transferred from the transfer unit 5 onto a plurality of pins 49 to then be placed onto the chuck member 46 to thereafter be carried by the arm 47 while being held on the member 46.

As is explicit from the foregoing, the present invention is not limited whatsoever to the use of or application in conjunction with the wafer belt conveyance members such as the conveyors 3 and 4 for the untreated wafer supply and the treated wafer discharge mechanisms. The invention can be employed in connection with various types of the wafer supply and discharge mechanisms, even where these mechanisms are substituted for the treating part of another wafer treating apparatus.

Figure 8:
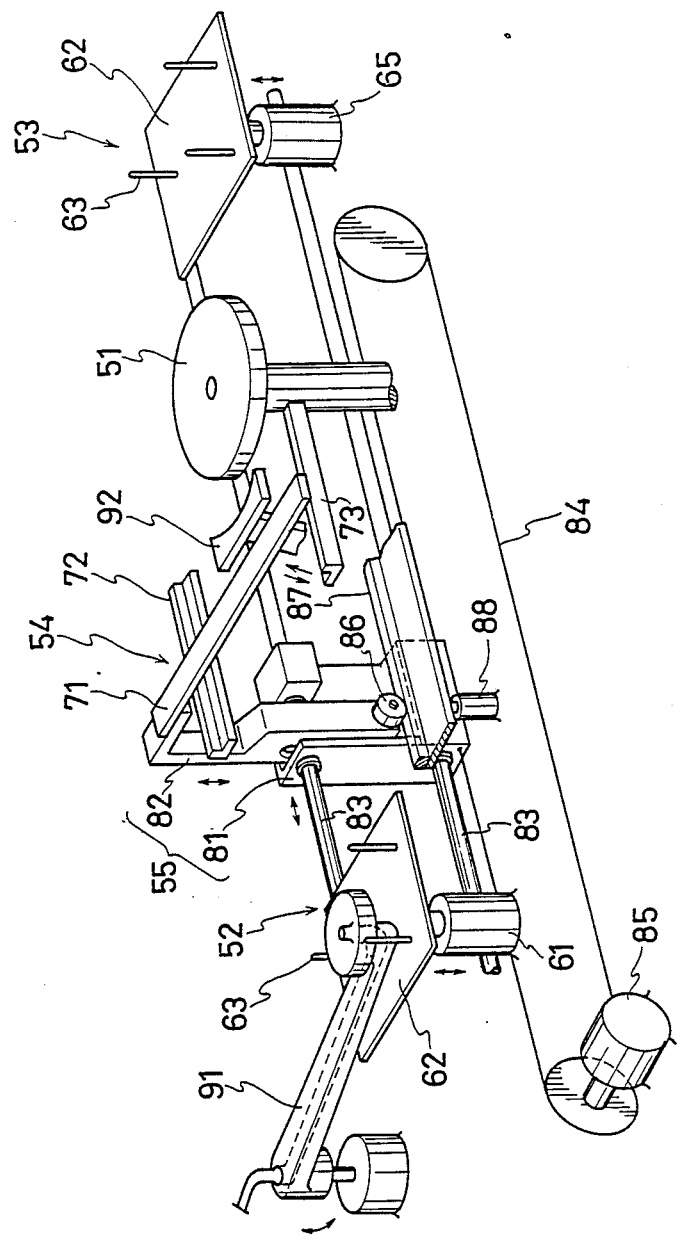
FIG. 8 is a perspective view depicting a wafer transporting device according to another preferred embodiment of the invention.
Figure 9:
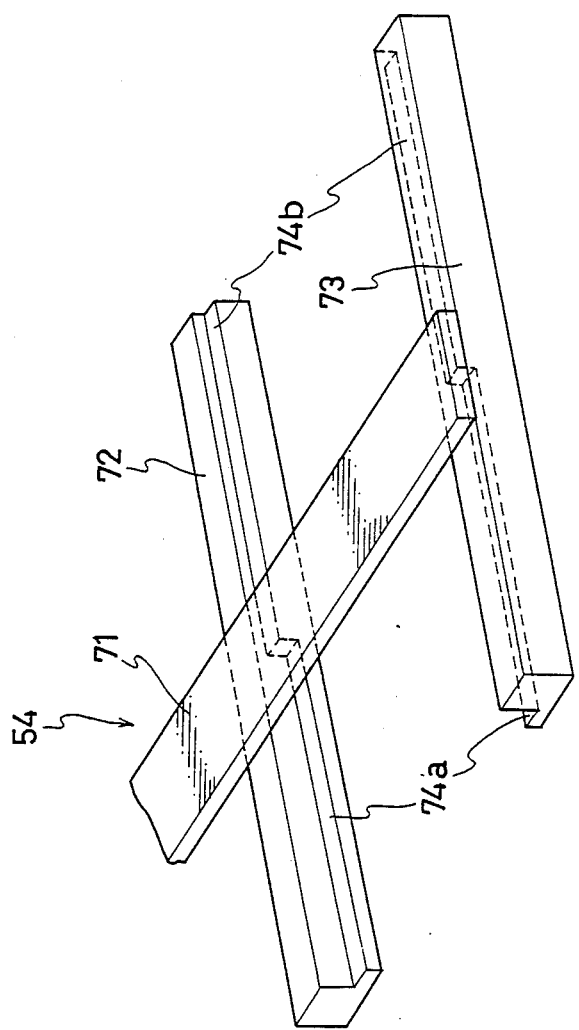
FIG. 9 is a perspective view showing a transfer unit according to the present invention.

FIG. 8 is a perspective view showing a wafer transferring device according to another preferred embodiment of the invention and FIG. 9 is a perspective view illustrating a wafer transfer unit of the invention.

In these figures, refernce numeral 51 denotes a rotary circular vacuum chuck for holding thereon through application of vacuum, which is provided in the treating part of the apparatus for treating the wafers while rotating the same. Across the chuck 51, there are disposed, oppositely to one another, a pair of wafer placing units 52 and 53 respectively for the untreated wafer supply and the treated wafer discharge mechanisms. In order to transfer the wafers from the unit 52 onto the chuck 51 and further from the chuck 1 to the unit 53, there is provided a transfer unit.

The unit 52 is assembled of a cylinder 61, a plate 62 supported on a piston rod of the cylinder 61, and plural pins 63 (three pins in this embodiment) formed on the plate 62 for placing at ends thereof the wafer W1 to be treated, the duty of which is to hold, in a manner to be movable up and down, the wafer W1 transported by an arm transporting device 91 that is horizontally pivotable. The unit 53 for the discharge mechanism, which is assembled equally to the unit 52, is also designed to mount the treated wafer W2 movably up and down by a cylinder 65.

Figure 4:
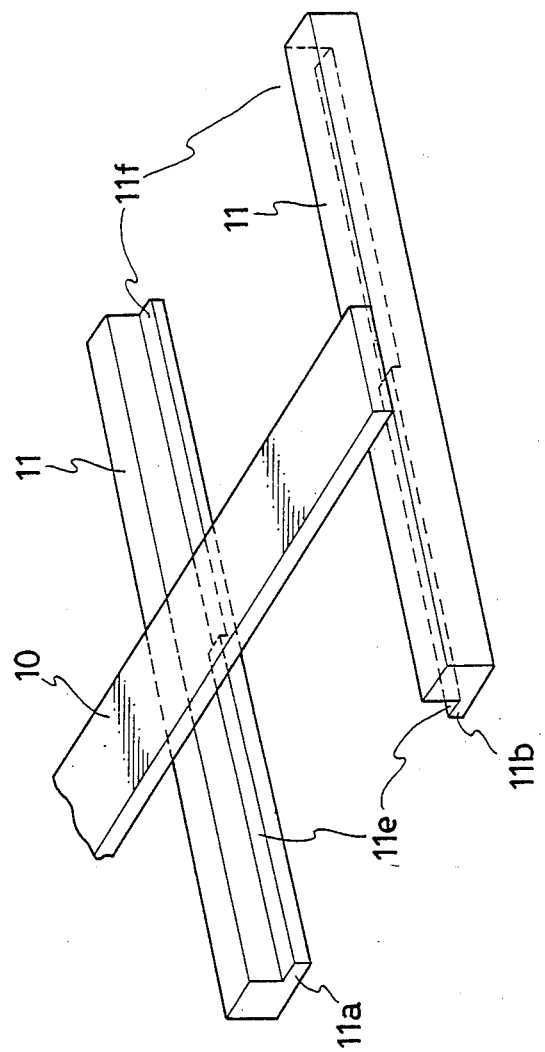
FIG. 4 is a perspective view depicting a wafer transfer unit.

The transfer unit 54 is constituted of a link arm 71 supported on an upper portion of a moving frame 82 to be described below in a manner to overhang the units 52 and 53 and the chuck 51 during horizontal motion thereof, and of a pair of holding arms 72 and 73, of L and reverse L cross-section shapes respectively as shown in FIG. 4, formed on the lower surface of the arm 71. The arms 72 and 73 are parallel and disposed oppositely relative to one another and aligned in the direction of wafer transfer. Each of the arms 72 and 73 is formed an individual projection, the projections facing inwardly toward one another. Each of the projections is divided into two segments 74a relatively closer to the unit 52 for the supply mechanism and 74b relatively closer to the unit 53 for the discharge mechanism with respect the center lines of those portions of the arms 72 and 73 which are connected with the arm 71. The upper surfaces of the former and latter segments are at different heights, i.e., the upper surface of the segment 74a for exclusively holding thereon the wafers W1 yet to be treated is lower than that of the segment 74b which serves to hold thereon the wafers W2 already treated. Since the upper surface of the segment 74b is designed to be higher than that of the segment 74a in this embodiment as mentioned above, the wafer W2, that has undergone the predetermined treatment (for example rinsing) that was conducted while the wafer W2 being held on the chuck 51, can always be set at a higher level than that of the wafer W1 to be treated. Consequently, fine particles etc. sticking to the untreated wafer W1 are prevented from adhering to and contaminating the treated wafer W2.

A carrier unit 55, being provided for supporting the transfer unit 54, is adapted to move horizontally between the placing units 52 and 53, and is formed of a base frame 81 and the moving frame 82. The frame 81 is horizontally movably mounted with a pair of guide bars 83 extending between the units 52 and 53 horizontally parallel with each other. Further, the frame 81 is fixed at its lower end on a timing belt 84 that is operated by a motor 85. Accordingly, the frame 81 is allowed to reciprocate between the units 52 and 53 by driving and reversely driving the motor 85. The frame 82 is mounted with the frame 81 such that the frame 82 is capable of moving right vertically through a guide such as a sliding bearing (not shown). On an outer surface of a lower end portion of the frame 82, there is rotatably supported a roller 86. Immediately beneath the roller 86 and parallel with the guide bars 83, there is disposed a rail 87 for supporting the roller 86, the roller 86 being movable up and down by an air cylinder 88. The cylinder 88 is fixed at its body with the main frame (not depicted) on the body of the treating apparatus, as are cases with the air cylinders 61 and 65. A piston rod of the cylinder 88 abuts against a lower surface of the rail 87. In order to move up and down the rail 87 horizontally, there are disposed a pair of the aforementioned cylinders 88 substantially at both end portions of the rail 87. (For simplicity, the illustration of the one of the two cylinders 88 is omitted in the drawing.) When the cylinders 88 are extended, the rail 87 is moved up and accordingly the frame 82 is raised through the roller 86.

Hereinafter, the level at which the link arm 71 of the transfer unit 54 is positioned without the piston rods of the air cylinders 88 being extended is referred to as a fourth level, whereas the level to which the arm 71 is raised by extending the piston rods to lift the frame 82 is termed a fifth level.

The levels of the segments 74a and 74b at the time the arm 71 is at the fourth level are set lower than that of the wafer holding surface of the chuck 51, while the levels of the segments 74a and 74b at the time the arm 71 is raised to the fifth level is set higher than that of the surface of the chuck 51. Furthermore, a level at which is a plane defined by the ends of the pins 63 of the unit 52 to place thereon the wafer W1 without the air cylinder 61 being stretched is referred to as a sixth level, and is set lower than that of the segments 74a at the time the arm 71 is at the fourth level. Meanwhile, a level to which the plane is raised by stretching the cylinder 61 is termed a seventh level, and is designed to be higher than that of the segment 74a at the time the arm 71 s at the fourth level.

In the meantime, a level at which the plane defined by the ends of the pins 63 of the unit 53 to place thereon the treated wafer W2 without the air cylinder 65 being stretched is termed an eighth level, and is set lower than that of the segment 74b at the time the arm 71 s at the fifth level. On the contrary, a level to which that plane is lifted by stretching the air cylinder 65 is denominated a ninth level, and is set higher than that of the segment 74b at the time the arm 71 is at the fifth level.

The above-described wafer transferring device of the invention operates as follows.

During the time when the predetermined treatments are applied to the wafer held on the chuck 51, the transfer unit 54 is at a position to stand by to transfer the wafer W1 to be treated next being held on the pins 63 of the unit 52 in the state where the segments 74a of the arms 72 and 73 are positioned across the pins 63 of the unit 52 in a manner to sandwich them, and the arm 71 is at the fourth level and the plane defined by the ends of the pins 63 of the unit 52 is at the seventh level. After completion of the treatments, the plane is lowered to the sixth level by retracting the cylinder 61, so that the wafer W1 on the ends of the pins 63 is placed onto the segments 74a of the arms 71 and 72.

Thereafter, the motor 85 is actuated to move the carrier unit 55 and accordingly also the transfer unit 54 toward the chuck 51 with the arm 71 at the fourth level until the segments 74b of the arms 72 and 73 arrive at predetermined positions beneath the wafer W2 on the chuck 51. When the above positions are reached by the segments 74b, the motor 85 is stopped, and then the air cylinder 88 is stretched to lift up the rail 87 in order for the arm 71 to reach the fifth level. Accordingly, the wafer W2 on the chuck 51 is picked or scooped up onto the segments 74b of the arms 72 and 73 during the arm 71 is raised toward the fifth level.

After the arm 71 reaches the fifth level, the motor 85 is driven to move the transfer unit 54 with the arm 72 kept at the fifth level until the unit 54 arrive at the placing unit 53 for the wafer discharge mechanism. When the unit 54 reaches the unit 53, the motor 85 is stopped, and then the air cylinder 65 is stretched to lift the plate 62 in order for the plane defined by the ends of the pins 63 of the unit 53 to be raised to the ninth level from the eighth level. Consequently, the wafer W2 on the segments 74b is picked up and placed onto the ends of the pins 63 during the plane is moved up toward the ninth level.

After the plane reaches the ninth level, the motor 85 is reversely driven to return the transfer unit 54 in the direction toward the aforementiooned stand-by position until the segments 74a of the arms 71 and 72 are situated above the chuck 51. When the segments 74a are thus situated, the motor 85 is stopped. During the returning of the unit 54, a detent piece 92 abuts against the front outer peripheral edge, as viewed in the moving direction, of the untreated wafer W1 on the segment 74a, in order that the center of the wafer W1 be positioned right above and vertically in alignment with the center of the wafer holding surface of the chuck 54. Thereafter, the cylinder 88 is retracted for the arm 71 to be lowered to the fourth level, and accordingly the wafer W1 on the segments 74a of the arms 72 and 73 is transferred therefrom onto the chuck 51. Then, the unit 54 is restored to the stand-by position by again actuating the motor 85 with the arm 71 being at the fourth level.

That side of the detent piece 92 which abuts against the outer peripheral edge of the wafer W1 is shaped to have the curvature of the peripheral edge of the wafer W1. Except when the wafer W1 to be treated is being transferred, the piece 92 is situated below a predetermined position whereat it makes contact with the wafer W1, to avoid posing an obstacle to the horizontal motion of the unit 54 between the units 52 and 53. The provision of the piece 92 may be even omitted where there is not required the accurate positioning of the untreated wafer W1 relative to the wafer holding surface of the chuck 51 as mentioned above.

Figure 10:
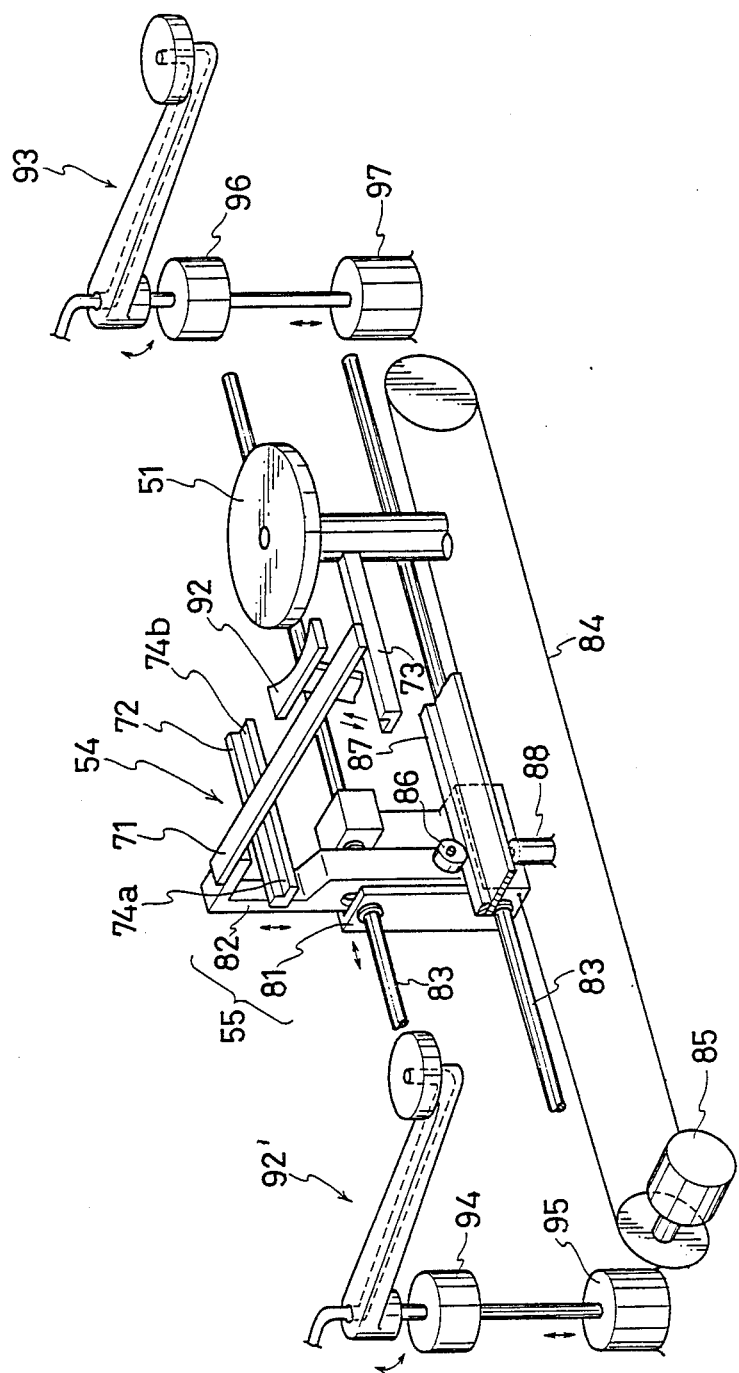
FIG. 10 is a perspective view illustrating a wafer transferring device according to still another preferred embodiment.

FIG. 10 is a perspective of another embodiment of wafer supply and discharge mechanisms. In contrast to the wafer placing units 52 and 53 in the last-mentioned embodiment, there are provided a pair of arm transporting units 92' and 93 that are vertically movable.

Specifically, an arm of the transporting unit 92' for the wafer supply mechanism is raised and lowered by actuating an air cylinder 95, and is horizontally rotatable by a driving member 94 so as to supply the wafers W1 to be treated to the transfer unit 54. In the meantime, the transporting unit 93 for the wafer discharge mechanism has a similar construction with an arm thereof being movable up and down by actuating an air cylinder 97 and horizontally rotatable by a driving member 96 to thus discharge the treated wafer W2 from the transfer unit 54.

Belts or like members may be substituted for the aforesaid transporting unit for the wafer supply and discharge mechanisms.

The wafer transferring device according to the foregoing embodiments incorporate mechanism for not merely reciprocating the transfer units 5 or 54, but also moving them up and down. In this connection, it is also possible that the carrier units 8 or 55 may be integrally provided with a member for enabling the up and down motions of the units 5 or 54 separately from the horizontal motion thereof. However, since many lines and wirings for driving and controlling such member are shifted about in association with the horizontal reciprocating motion of the units 8 or 55, the required durability thereof is hard to assure. Furthermore, there is a possibility that the increased weight of the units 8 or 55 due to the provision of the member may cause obstruction to the quick horizontal reciprocating motion of the units 5 or 54. Moreover, it is also possible that the wafer transferring device may be arranged to be moved up and down as a whole. However, since the transferring device is of considerable weight for the purpose of attaining smooth and accurate horizontal reciprocation of the units 5 or 54, a moving mechanism for raising and lowering the device in its entirety is undesirable because of unavoidable large-sized structures required.

While the preferred embodiments of the present invention have been described above, it should be understood that various modifications may be made herein without departing the spirit of the invention and scope of the appended claims.

What is claimed is:

1. A wafer transferring device for transferring a wafer to be treated from a wafer supply part of a wafer treating apparatus to a wafer holding member in a treating part of said apparatus and for transferring a wafer already treated from said holding member to a wafer discharge part of said apparatus, said device comprising:

a base member reciprocating between said wafer supply part and said wafer discharge part via said wafer holding member;

a vertically movable member being mounted with said base member so as to be reciprocated integrally therewith;

a guide member provided on said base member for vertically guiding said vertically movable member;

transfer means, fixed on said vertically movable member, for placing thereon said wafer to be treated and said wafer already treated;

a member extending parallel with a direction in which said base member reciprocates, said extending member being adapted to move in contact with and away from said vertically movable member; and driving means for vertically moving said extending member parallel with said direction to thereby move said vertically movable member vertically relative to said base member utilizing said guide member.

2. A wafer transferring device for a wafer treating apparatus for transferring an untreated wafer from a wafer supply station to a wafer holding member and for transferring a treated wafer from the holding member to a wafer discharge station, each said wafer supply station, wafer discharge station and wafer holding member having a respective wafer placing surface associated therewith, said device comprising:

transfer means for supporting said treated and untreated wafers thereon, said transfer means being movable to different heights relative to a reference height, said heights including different plural levels including first, second and third levels, said transfer means further including a first surface relatively closer to said wafer supply station for holding an untreated wafer and a second surface relatively closer to said wafer discharge station for holding a treated wafer;

first moving means for reciprocating said transfer means between said wafer supply and discharge stations via said holding member and second moving means for moving said transfer means vertically to and from said different plural levels; and means for controlling said second moving means such that said first surface is located lower than said wafer placing surfaces of said wafer supply station and said holding member when said transfer means is positioned at said first level, said first surface is located higher than said wafer holding surfaces of said wafer supply station and said wafer holding member when said transfer means is positioned at said second and third levels, said second surface is located lower than said wafer holding surfaces of said holding member and said wafer discharge station when said transfer means is positioned at said first and second levels, and said second surface is located higher than said wafer holding surfaces of said holding member and said wafer discharge station when said transfer means is positioned at said third level.

3. A wafer transferring device for a wafer treating apparatus for transferring an untreated wafer from a wafer supply station to a wafer holding member and for transferring a treated wafer from the holding member to a wafer discharge station, each said wafer supply station, wafer discharge station and wafer holding member having a respective wafer placing surface associated therewith, said device comprising:

transfer means for supporting said treated and untreated wafers thereon, said transfer means being movable to different heights relative to a reference height, said heights including different plural levels including first and second levels, said transfer means further including a first surface relatively closer to said wafer supply station for holding an untreated wafer and a second surface relatively closer to said wafer discharge station for holding a treated wafer;

first moving means for reciprocating said transfer means between said wafer supply and discharge stations via said holding member and second moving means for moving said transfer means vertically to and from said different plural levels, at said first level said first and second surfaces of said transfer means being lower than said wafer holding surface of said holding member and at said second level said first and second surfaces of said transfer means being higher than said wafer holding surface of said holding member;

third moving means for moving said wafer supply station and said wafer discharge station vertically and independently of one another; and means for controlling said third moving means such that the wafer placing surface on the wafer supply station is capable of being placed higher and lower than said first surface when said transfer means is positioned at said first level, and for further controlling said third moving means such that said wafer placing surface of said wafer discharge station may be positioned higher and lower than said second surface when said trasfer means is positioned at said second level.

4. The device as in claim 3, wherein said first surface is positioned lower than said second surface.

* * * * *